(12) United States Patent
Yamaguchi et al.

(10) Patent No.: US 6,389,091 B1
(45) Date of Patent: May 14, 2002

(54) DIGITAL PHASE LOCKED LOOP CAPABLE OF SUPPRESSING JITTER

(75) Inventors: Michimasa Yamaguchi; Tetsuya Oota, both of Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/229,742

(22) Filed: Jan. 14, 1999

(30) Foreign Application Priority Data

Jan. 14, 1998 (JP) .......................................... 10-005760

(51) Int. Cl.⁷ ................................................ H03D 3/24
(52) U.S. Cl. ........................ 375/376; 375/375; 327/158; 331/57
(58) Field of Search ................................ 375/375, 376, 375/371; 327/149, 152, 153, 158, 161, 270, 272, 276, 278, 285, 288, 264; 331/57; 713/401

(56) References Cited

U.S. PATENT DOCUMENTS

| | | | |
|---|---|---|---|
| 5,077,529 A | * 12/1991 | Ghoshal et al. | 327/152 |
| 5,331,294 A | 7/1994 | Watanabe et al. | 331/57 |
| 5,347,234 A | 9/1994 | Gersbach et al. | 331/57 |
| 5,389,898 A | * 2/1995 | Taketoshi et al. | 331/2 |
| 5,438,300 A | 8/1995 | Saban et al. | 331/16 |
| 5,451,911 A | * 9/1995 | Colvin et al. | 331/57 |
| 5,687,202 A | 11/1997 | Eitrheim | 375/386 |
| 5,748,125 A | 5/1998 | Cederbaum et al. | 341/136 |
| 5,771,264 A | * 6/1998 | Lane | 375/376 |
| 6,271,730 B1 | * 8/2001 | Abe et al. | 331/34 |

FOREIGN PATENT DOCUMENTS

| | | |
|---|---|---|
| EP | 0 639 003 | 2/1995 |
| EP | 0 712 204 | 5/1996 |
| EP | 0 792 019 | 8/1997 |
| JP | 3-153124 | 7/1991 |
| JP | 3-206726 | 9/1991 |
| JP | 5-315899 | 11/1993 |
| JP | 9-214334 | 8/1997 |
| JP | 9-275332 | 10/1997 |

* cited by examiner

Primary Examiner—Tesfaldet Bocure
Assistant Examiner—Phuong Phu
(74) Attorney, Agent, or Firm—Sughrue Mion, PLLC

(57) ABSTRACT

A digital phase locked loop keeps an output signal exactly in phase and frequency with a reference signal. An oscillator has a plurality of delay elements which are connected to one another in a loop to produce the output signal. Each of the delay elements has a delay which is controlled by one of digital control signal sets supplied from a controller. A total delay of the delay elements decides a frequency of the output signal. A phase comparator is connected to the oscillator to compare the output signal with the reference signal in phase and frequency to produce an error signal. A controller is connected between the phase comparator and the oscillator to produce the digital control signal sets in response to the error signal.

18 Claims, 14 Drawing Sheets

| S4 | S3 | S2 | S1 | DELAY |
|---|---|---|---|---|
| L | L | L | H | 1 TIME |
| L | L | H | H | 2 TIMES |
| L | H | L | H | 3 TIMES |
| L | H | H | H | 4 TIMES |
| H | L | L | H | 5 TIMES |
| H | L | H | H | 6 TIMES |
| H | H | L | H | 7 TIMES |
| H | H | H | H | 8 TIMES |

FIG. 10A

| S4 | S3 | S2 | S1 | DELAY |
|---|---|---|---|---|
| L | L | L | H | 1 TIME |
| L | L | H | H | 1.1 TIMES |
| L | H | L | H | 1.2 TIMES |
| L | H | H | H | 1.3 TIMES |
| H | L | L | H | 2 TIMES |
| H | L | H | H | 4 TIMES |
| H | H | L | H | 8 TIMES |
| H | H | H | H | 10 TIMES |

FIG. 10B

DIGITAL PHASE LOCKED LOOP CAPABLE OF SUPPRESSING JITTER

BACKGROUND OF THE INVENTION

This invention relates to a digital phase locked loop which keeps an output signal exactly in phase and frequency with a reference signal, particularly, relates to a digital phase locked loop which is used for an LSI, such as an ASIC (application specific integrated circuit).

A conventional digital phase locked loop comprises a phase comparator which compares phase and frequency of a feedback signal with those of an reference signal supplied from an outer circuit. The phase comparator produces an error signal which is representative of frequency difference between the feedback signal and the reference signal. A low pass filter is connected to the phase comparator and filters the error signal to produce an analog control signal. A voltage controlled oscillator is connected to the low pass filter and the phase comparator and produces an output signal having a frequency which depends on the analog control signal. The output signal is supplied to, for example, an inner circuit of an LSI and to the phase comparator as the feedback signal.

The voltage controlled oscillator has a plurality of delay elements which is connected to one another in a ring so as to form a ring oscillator. Each of delay elements has a delay which is changed by the analog control signal. A total delay of the delay elements decides the frequency of the output signal.

The conventional digital phase locked loop has a defect that the output signal is greatly influenced by noise added to the analog control signal. The noise brings jitters on the output signal. In addition, the conventional digital phase locked loop has a large size because it needs the low pass filter.

Another conventional digital phase locked loop comprises a phase comparator which compares phase and frequency of a feedback signal with those of a reference signal supplied from an outer circuit. The phase comparator produces an up/down signal for increasing/decreasing the frequency of the feedback signal. A control circuit is connected to the phase comparator and produces the digital control signal in response to the up/down signal. An oscillator is connected to the control circuit and the phase comparator and produces an output signal which has a frequency controlled by the digital control signal. The output signal is supplied to an inner circuit of an LSI and to the phase comparator as the feedback signal.

The oscillator has a plurality of delay elements which are connected one another. Each of the delay elements has a fixed delay. The delay elements are selectively activated by the digital control signal. Activated delay elements forms a ring oscillator. A total delay of the activated delay elements decides a frequency of the output signal.

The conventional digital phase locked loop has a fault that the frequency of the output signal is discontinuously changed by the digital control signal. This increases jitters added on the output signal. Moreover, the conventional digital phase locked loop has another fault that it is necessary to control a timing of activation/inactivation of the delay elements. In addition, the conventional digital phase locked loop uses large electricity.

SUMMARY OF THE INVENTION

It is therefore an object of this invention to provide a digital phase locked loop which is capable of suppressing jitters on an output signal.

It is another object of this invention to provide a digital phase locked loop which has a small size and uses small electricity.

It is still another object of this invention to provide a digital phase locked loop that it is easy to control.

Other object of this invention will become clear as the description proceeds.

On describing the gist of this invention, it is possible to understand that a digital phase locked loop keeps an output signal exactly in phase and frequency with a reference signal.

According to the gist of this invention, the digital phase locked loop comprises a phase comparator which compares a feedback signal with the reference signal in phase and frequency to produce an error signal representative of frequency difference between the feedback signal and the reference signal. A controller is connected to the phase comparator to produce a plurality of digital control signal sets in response to the error signal. An oscillator has a plurality of delay elements which are connected to the controller and connected to one another in a loop. Each of the delay elements has a delay which is controlled by one of the digital control signal sets. The oscillator produces the output signal which has a frequency decided by a total delay of the delay elements. A feedback line is connected between the oscillator and the phase comparator to feed back the output signal to the phase comparator as the feedback signal.

According to another gist of this invention, a delay element is used in a ring oscillator together with the preceding and the following delay elements. The delay element has a delay which is controlled by a digital control signal set. The digital control signal set includes first and second groups of digital control signals. The delay element comprises an input terminal which is connected to the preceding delay element. An output terminal is connected to the following delay element. A plurality of first P type transistors have first sources supplied with source voltage, first drains, and first gates being for receiving the first group. A second P type transistor has a second source connected to the first drains, a second drain connected to the output terminal, and a second gate connected to the input terminal. A plurality of first N type transistors have third sources connected to the ground, third drains, and third gates being for receiving the second group. A second N type transistor has a fourth source connected to the third drains, a fourth drain connected to the output terminal, and a fourth gate connected to the input terminal.

According to still another gist of this invention, a delay element being for use in a ring oscillator together with the preceding and the following delay element. The delay element has a delay which is controlled by a digital control signal set. The digital control signal set includes third and fourth groups of digital control signals. The delay element comprises an input terminal is connected to the preceding delay element. An output terminal is connected to the following delay element. A third P type transistor has a fifth source supplied with source voltage, a fifth drain, and a fifth gate connected to the input terminal. A plurality of fourth P type transistors have sixth sources connected to the fourth drain, sixth gates connected to the output terminal, and sixth drains being for receiving the third group. A third N type transistor has a seventh source connected to the ground, a seventh drain, and a seventh gate connected to the input terminal. A plurality of fourth N type transistors have eighth sources connected to the seventh drain, eighth drains connected to the output terminal, and eighth gates being for receiving the fourth group.

BRIEF DESCRIPTION OF THE DRAWING

FIGS. 10A and 10B are truth tables for describing operations of delay elements of FIG. 9;

DESCRIPTION OF THE PREFERRED EMBODIMENT

Figure 1:
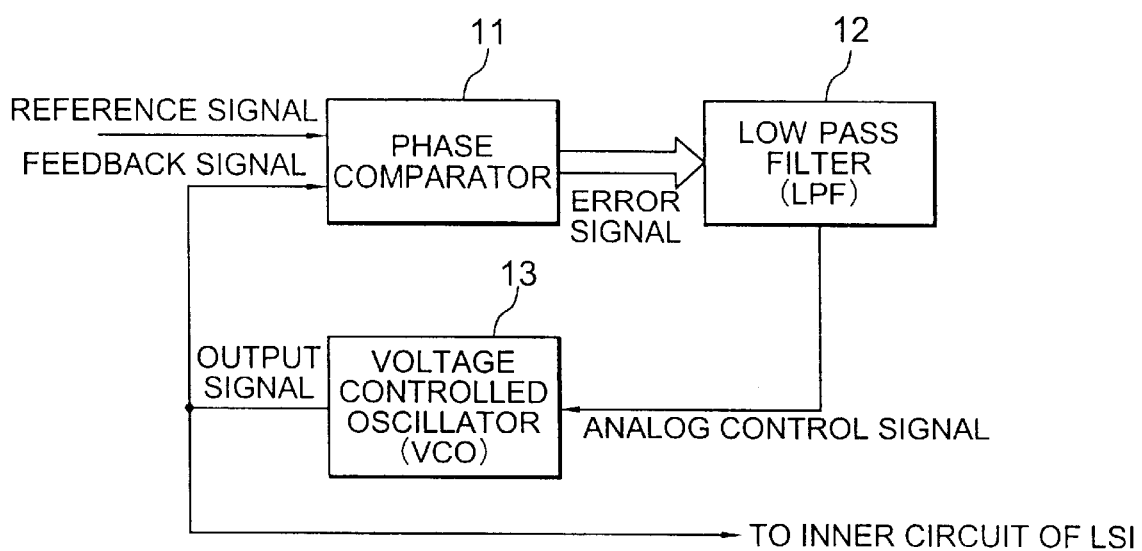
FIG. 1 is a block diagram of a conventional digital phase locked loop.
Figure 2:
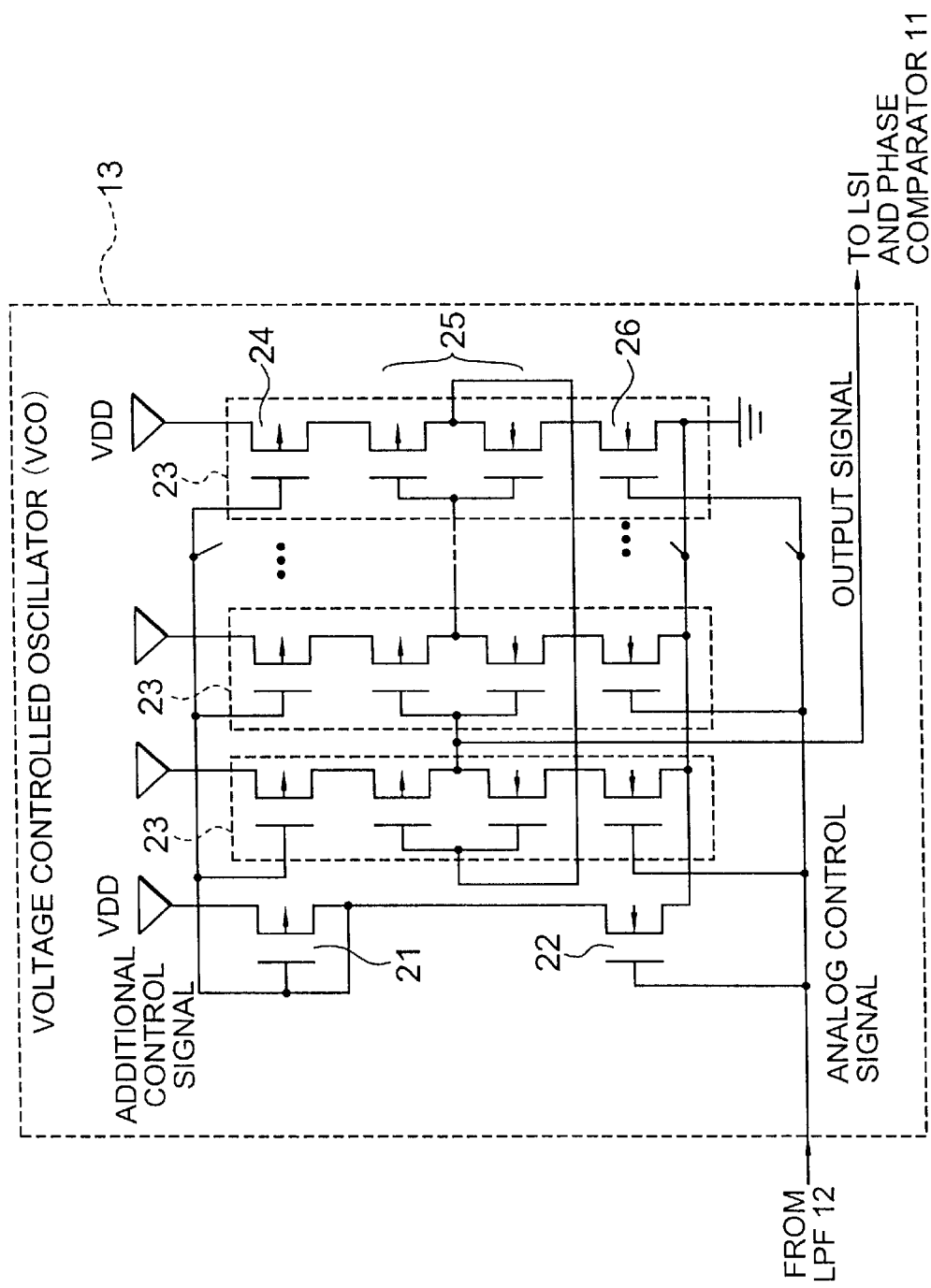
FIG. 2 is a circuit diagram of a voltage controlled oscillator used in the digital phase locked loop of FIG. 1.
Figure 3:
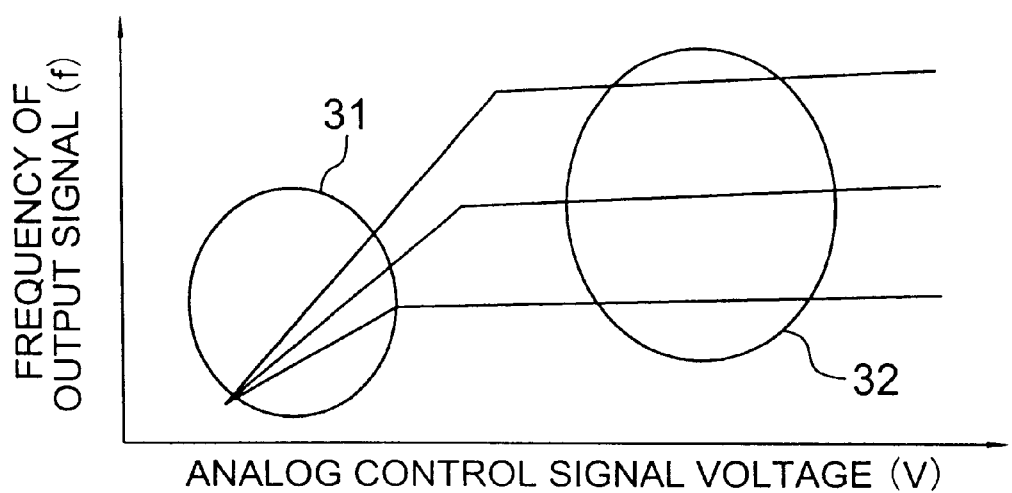
FIG. 3 is a graph for describing relations between voltage of an analog control signal and a frequency of output signal in the digital phase locked loop of FIG. 1.

Referring to FIGS. 1 through 3, description will be at first directed to a conventional digital phase locked loop for a better understanding of this invention.

In FIG. 1, a conventional digital phase locked loop comprises a phase comparator 11 which receives a feedback signal and a reference signal supplied from an outer circuit (not shown). The phase comparator 11 compares the feedback signal with the reference signal to produce an error signal representative of frequency difference between the feedback signal and the reference signal. A low pass filter 12 is connected to the phase comparator 11 and filters the error signal to produce the analog control signal. A voltage controlled oscillator 13 is connected to the low pass filter 12 and the phase comparator 11 and produces an output signal which has a frequency decided by the analog control signal. The output signal is supplied to an LSI (not shown), such as an ASIC, and to the phase comparator 11 as the feedback signal. In this structure, the output signal is controlled so as to reduce the frequency difference.

In FIG. 2, the voltage controlled oscillator 13 has a P type transistor 21, an N type transistor 22, and a plurality of delay elements 23. Each of the delay element 23 has a P type transistor 24, an inverter 25, and an N type transistor 26.

The P type transistor 21 has a source supplied with source voltage VDD, a drain, and a gate connected to the drain. The N type transistor 22 has a source connected to the ground, a drain connected to the drain of the P type transistor 21, and a gate connected to the low pass filter 12 (see FIG. 1). The P type transistor 21 and the N type transistor 22 produce an additional control signal on the drain of the P type transistor 21.

In each of the delay elements 23, the P type transistor 24 has a source supplied with the source voltage VDD, a drain, and a gate connected to the drain of the P type transistor 21. The inverter 25 has a first voltage supplying terminal connected to the drain of the P type transistor 24, a second voltage supplying terminal, an input terminal connected to the preceding stage of the delay elements 23, and the output terminal connected to the following stage of the delay elements 23. Namely, the inverters 25 are connected to one another in a loop. The output signal of the voltage controlled oscillator 13 is led out from a connection between a first stage and a second stage of the delay elements 23. The N type transistor 26 has a source connected to the ground, a drain connected to the second voltage supplying terminal, and a gate connected to the low pass filter 12. Therefore, the delay elements 23 form a ring oscillator.

If the analog control signal becomes large in voltage, the P type transistor 21 and the N type transistor 22 make the additional control signal small in voltage. Then, currents flowing through the delay elements 23 from the source voltage VDD to the ground increase. The increase of the currents makes delay of the delay elements 23 small. Therefore, the frequency of the output signal becomes large.

If the analog control signal becomes small in voltage, the additional control signal becomes large in voltage. Then, the currents decrease and the delay becomes large. Therefore, the frequency of the output signal becomes small.

The digital phase locked loop has faults as follows. The delay stages 23 have a common delay. In other words, the delay of each delay stage 23 can not be individually set. This is because, the P type transistors 24 receives the additional control signal at the gates in common and the N type transistors 26 receives the analog control signal at the gates in common.

Moreover, a block size of the digital phase locked loop is large. This is because the digital phase locked loop uses the low pass filter 13 to produce the analog control signal.

IF the source voltage VDD becomes low, noises included in the analog control signal make jitters added on the output signal large.

FIG. 3 shows three frequency characteristics of three digital phase locked loops which are the type as shown in FIG. 1. In FIG. 3, a vertical axis indicates frequency of the output signals while a horizontal axis indicates voltage of the analog control signals. In a lower voltage range 31, each of the frequencies is greatly changed by change of each of the analog control signals. In a higher voltage range 32, the frequencies are not changed greatly by change of the analog control signals.

It is easily understood from FIG. 3, that the digital phase locked loop normally operates when the voltage is within the lower voltage range 31. However, in this case, the output signal is greatly influenced by the noises added on the analog control signal as mentioned above.

On the other hand, the output signal is not greatly influenced by the noises added on the analog control signal when the voltage is within the large voltage range 32. However, the digital phase locked loop does not normally operate in this case. This is because devices included in the digital phase locked loop are of uneven quality.

Figure 4:
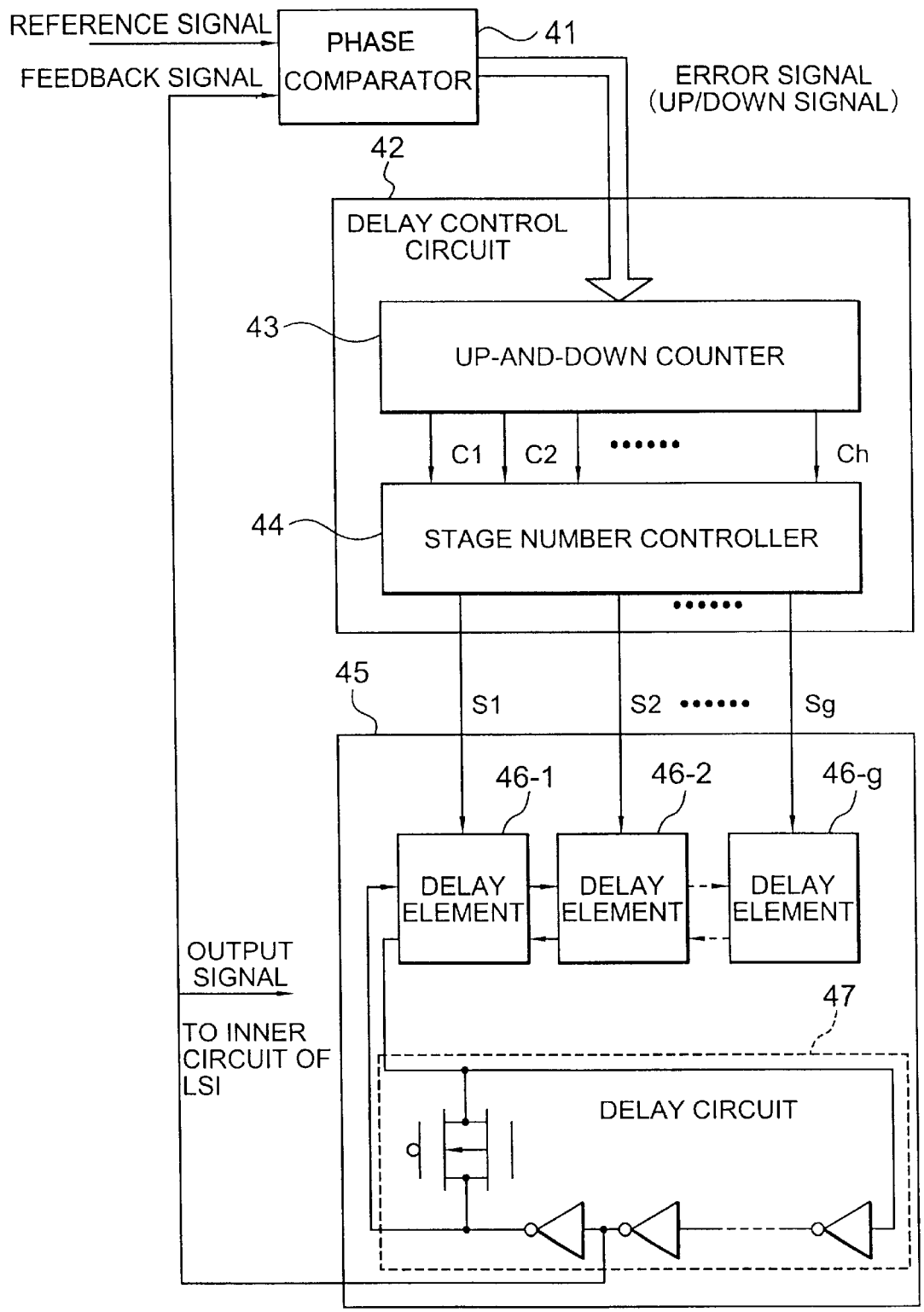
FIG. 4 is a block diagram of another conventional digital phase locked loop.
Figure 5:
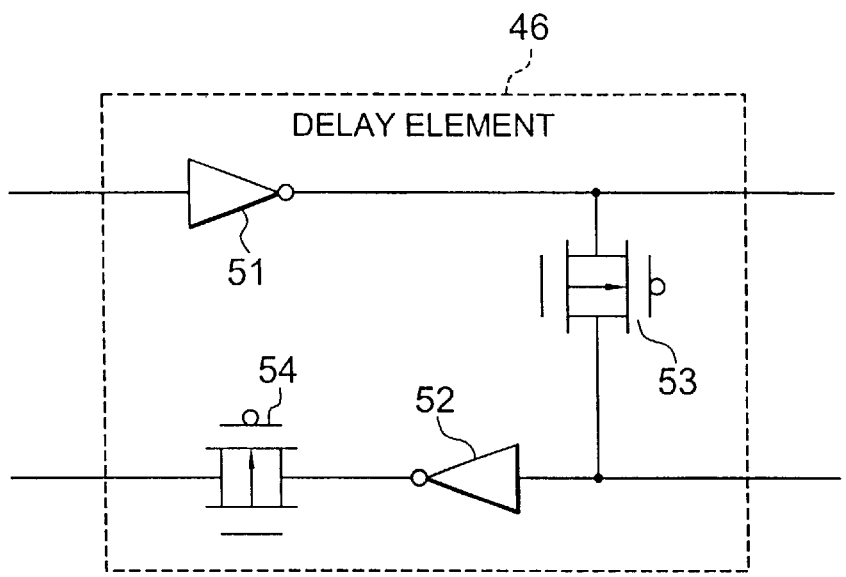
FIG. 5 is a circuit diagram of a delay element used in the digital phase locked loop of FIG. 4.
Figure 6:
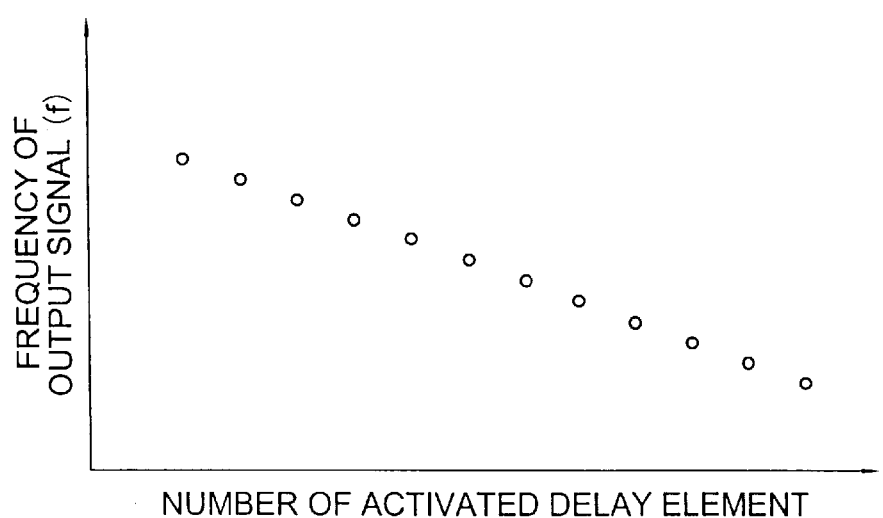
FIG. 6 is a graph for describing a relation between the number of activated delay elements and a frequency of an output signal in the phase locked loop of FIG. 4.

Referring to FIGS. 4 through 6, description will be made about another conventional digital phase locked loop.

In FIG. 4, the digital phase locked loop comprises a phase comparator 41 which compares a feedback signal with a reference signal supplied from an outer circuit (not shown) in phase and frequency to produce an error signal. The error signal is an up/down signal for increasing/decreasing the frequency of the feedback signal. In other words, the up/down signal represents that the frequency of feedback signal is lower/higher than that of the reference signal. A delay control circuit 42 is connected to the frequency comparator 41 and has an up-and-down counter 43 and a stage number controller 44. The up-and-down counter 43 produces counting signals C1 through Ch (h: natural number) in response to the error signal. The counting signals are representative of a counting value as a whole. The stage number controller 44 receives the counting signals C1–Ch from the up-and-down counter 43 to produce activating signals S1 through Sg (g: natural number). An oscillator 45 is connected to the delay control circuit 42 and the phase comparator 41 to produce an output signal in response to the activating signals S1–Sg. The oscillator 45, includes a plurality of delay elements 46-1 through 46-g and a delay circuit 47 to form a ring oscillator. The delay elements 46-1 through 46-g are individually activated by the activating signals S1 through Sg. The number of the delay elements 46 activated by the activating signal decides delay in the oscillator 45 and decides the frequency of the output signal. The output signal supplied to an inner circuit of an LSI (not shown) and the phase comparator 41 as the reference signal.

Each of the delay elements 46 is formed as shown in FIG. 5. Namely, each of the delay elements 46 comprises first and second inverters 51 and 52 and first and second transfer gates 53 and 54. The first inverter 51 has a first input terminal connected to the preceding delay element 46 and has a first output terminal connected to the following delay element 46. The second inverter 52 has a second input terminal connected to the following delay element 46 and has a second output terminal connected to the preceding delay element 46 through the second transfer input terminal.

The activating signals are classified into two types. A first type is for deciding the last stage of activated delay elements 46 and the second type is for deciding a middle stage of the activated delay elements 46. When the delay element 46 receives the first type of the activating signal, both of the first and the second transfer gates 53 and 54 turn on. When the delay element receives the second type of the activating signal, the first transfer gate 53 turns off and the second transfer gate 54 turns on.

Returning to FIG. 4, the delay element 46-1 is connected to the delay circuit 47 instead of the preceding delay element 46. The delay circuit 47 comprises three or more inverters, which is connected to one another in serial. The number of the inverters is an odd number. A transfer gate is connected to the inverters to form a loop together with them. The transfer gate turns on when the activating signal S1 is not supplied to the delay element 46-1. The output signal of the oscillator 45 is led out from an input terminal of the inverter connected to the delay element 46-1. The delay circuit 47 decides a maximum frequency of the output signal. The frequency of the output signal depends on the number of the delay elements 46 activated by the activating signals. Namely, the frequency depends on a total of the delay of the delay elements 46 activated by the activating signals. When the delay elements 46 are not activated by the activating signals, the frequency is the maximum frequency. When all of the delay elements 46 are activated by the activating signals, the frequency is a minimum frequency.

The frequency against the number of the delay elements 46 activated by the activating signal is shown in FIG. 6. As shown in FIG. 6, the frequency takes discontinuous value. Each of frequency steps is dependent on a delay of each delay element 46. The delay is equal to or larger than a total of delays of the first and the second inverters 51 and 52 and the first and the second transfer gates 53 and 54.

The digital phase locked loop has faults as follows.

In the digital phase locked loop, it is difficult to make the output signal correspond to the reference signal and it is easy to bring jitters on the output signal. This is because the number of the activated delay elements discontinuously changes the frequency of the output signal.

Moreover, it is necessary to control timing of activation or inactivation of the delay elements 46. If the timing is not controlled, pulse width of the output signal is changed and the digital phase locked loop malfunctions.

In addition, the digital phase locked loop uses more electricity than that as illustrated in FIG. 1. Because the digital phase locked loop has the many delay elements.

Referring to FIGS. 7 through 11, the description will proceed to a digital phase locked loop according to a preferred embodiment of this invention.

Figure 7:
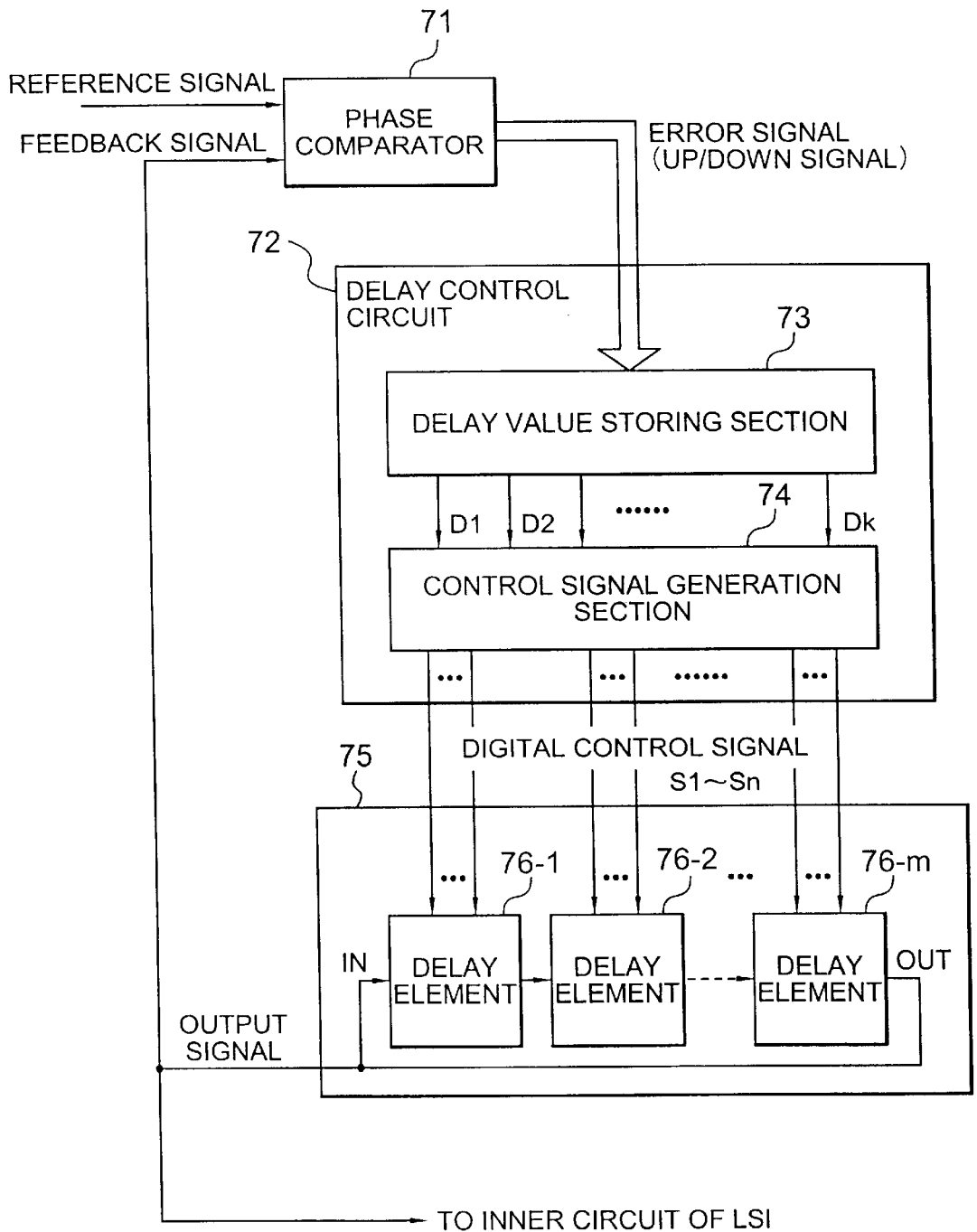
FIG. 7 is a block diagram of a digital phase locked loop according to a preferred embodiment of this invention.
Figure 8:
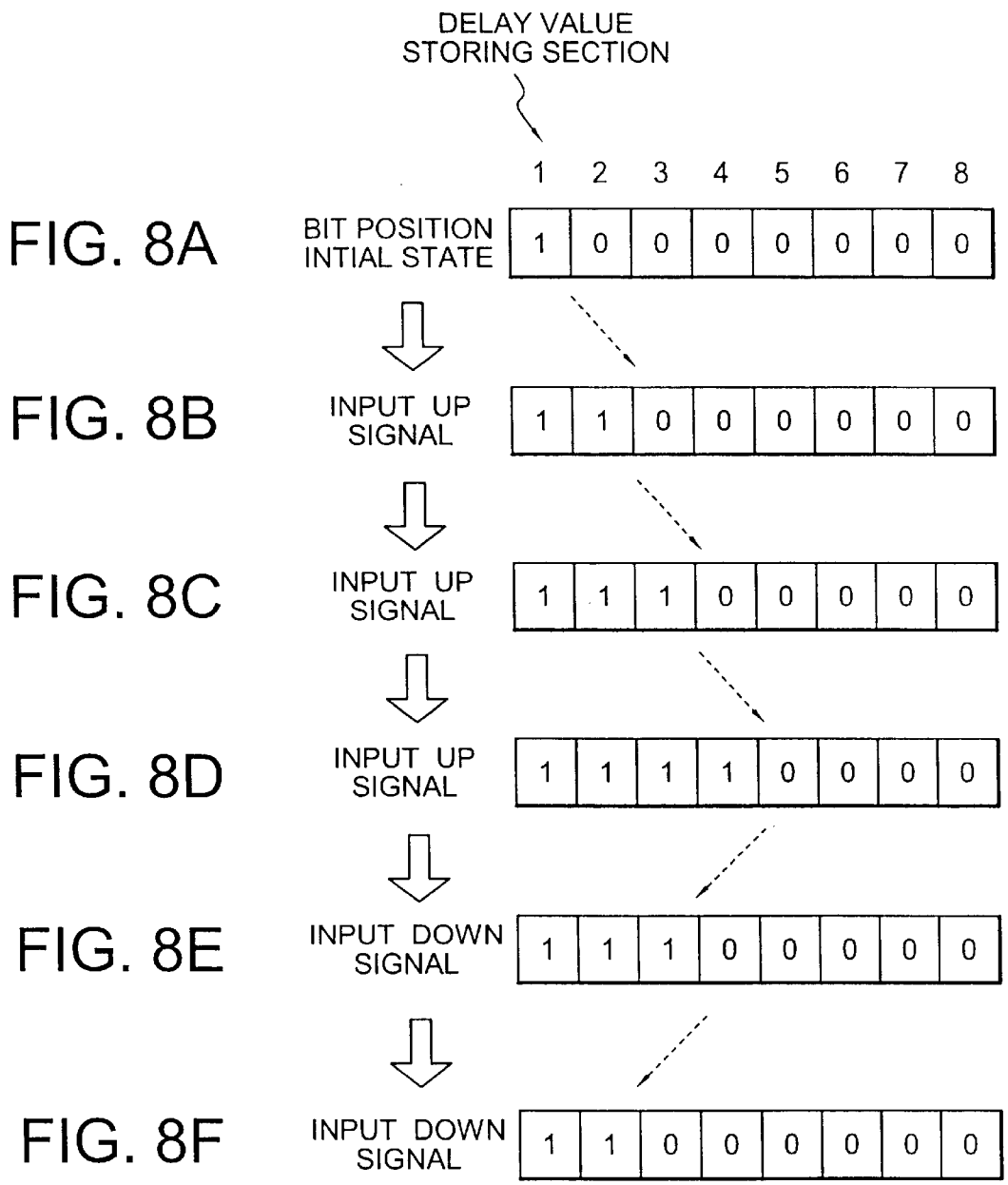
FIGS. 8A through 8F are state charts for describing an operation of a delay value storing section used in the digital phase locked loop of FIG. 7.

In FIG. 7, a digital phase locked loop comprises a phase comparator 71 which compares a feedback signal with a reference signal supplied from an outer circuit (not shown) in phase and frequency to produce an error signal. The error signal is an up/down signal which is for increasing/decreasing the frequency of the feedback signal. In other words, the up/down signal represents that the frequency of feedback signal is lower/higher than that of the reference signal. A delay control circuit 72 is connected to the phase comparator 71 to produce digital control signal sets in response to the error signal. The digital control signal sets include digital control signals S1 through Sn. The delay control circuit 72 includes a delay value storing section 73 and a control signal generating section 74. The delay value storing section 73 is connected to the phase comparator 71 and the control signal generator section 74. The delay value storing section 73 stores a delay value which is representative of a total value mentioned later and which is changed by the error signal. The delay value storing section 73 produces a delay value signal which includes a plurality of data signals D1 through Dk (k: natural number) to represent the delay value. The control signal generating section 74 receives the delay value signal to produce the digital control signal sets. An oscillator 75 is connected to the delay control circuit 72 and has a plurality of delay elements 76-1 thorough 76-m (m: natural number). The delay elements 76 are connected to one another in a loop to form a ring oscillator. In other words, each of the delay elements 76 has an input terminal connected to the preceding delay element 76 and an output terminal connected to the following delay element 76. Each of the delay elements 76 has a delay which is individually controlled by each of the digital control signal sets. The number of active delay elements 76 is unchanged. Accordingly, a timing adjustment for changing the number of delay stages is unnecessary. A total delay of the delay elements 76 is decided by the delay value stored in the delay value storing section 73 and decides a frequency of an output signal. The output signal is led out from the output terminal of the delay element 76-m and supplies to an inner circuit of an LSI (not shown) and to the phase comparator as the feedback signal.

In this structure, the frequency of the output signal is controlled so that the frequency of the feedback signal accords with that of the reference signal. Because the delay of each delay element 76 can be finely changed by the digital control signal set, the digital phase locked loop can almost continuously change the frequency of the output signal by the use of a small number of the delay elements. Namely, the digital phase locked loop can make the output signal accord with the reference signal.

Referring to FIGS. 8A through 8F, an operation of the delay value storing section 73 is described below. It is assumed that the delay value storing section 73 is an eight bits bi-directional shift register.

In FIG. 8A, the delay value storing section 73 is in an initial state. In this state, a least significant bit (or a first bit) is "1". The remaining bits are "0".

If the delay value storing section 73 in the initial state receives an up signal as the error signal, a second bit becomes "1" and the first bit keeps "1" as shown in FIG. 8B.

If the delay value storing section 73 in the state of FIG. 8B receives another up signal, a third bit becomes "1" and the first and the second bits keep "1" as shown in FIG. 8C.

If the delay value storing section 73 in the state of FIG. 8C receives a third up signal, a fourth bit becomes "1" and the first through the third bits keep "1" as shown in FIG. 8D.

If the delay value storing section 73 in the state of FIG. 8D receives a down signal as the error signal, a fourth bit becomes "0" and the first through the third bits keep "1" as shown in FIG. 8E.

If the delay value storing section 73 in the state of FIG. 8E receives another down signal, a third bit becomes "0" and the first and the second bits keep "1" as shown in FIG. 8F.

The delay value storing section 73 operates as mentioned above and produces the data signals D1 through D8 which are representative of states of the eight bits. When the feedback signal accords with the reference signal, the error signal is not supplied to the delay value. Accordingly, the data signals D1 through D8 are unchanged in this case and the frequency of the output signal is kept in a state that the feedback signal accords with the reference signal.

Figure 9:
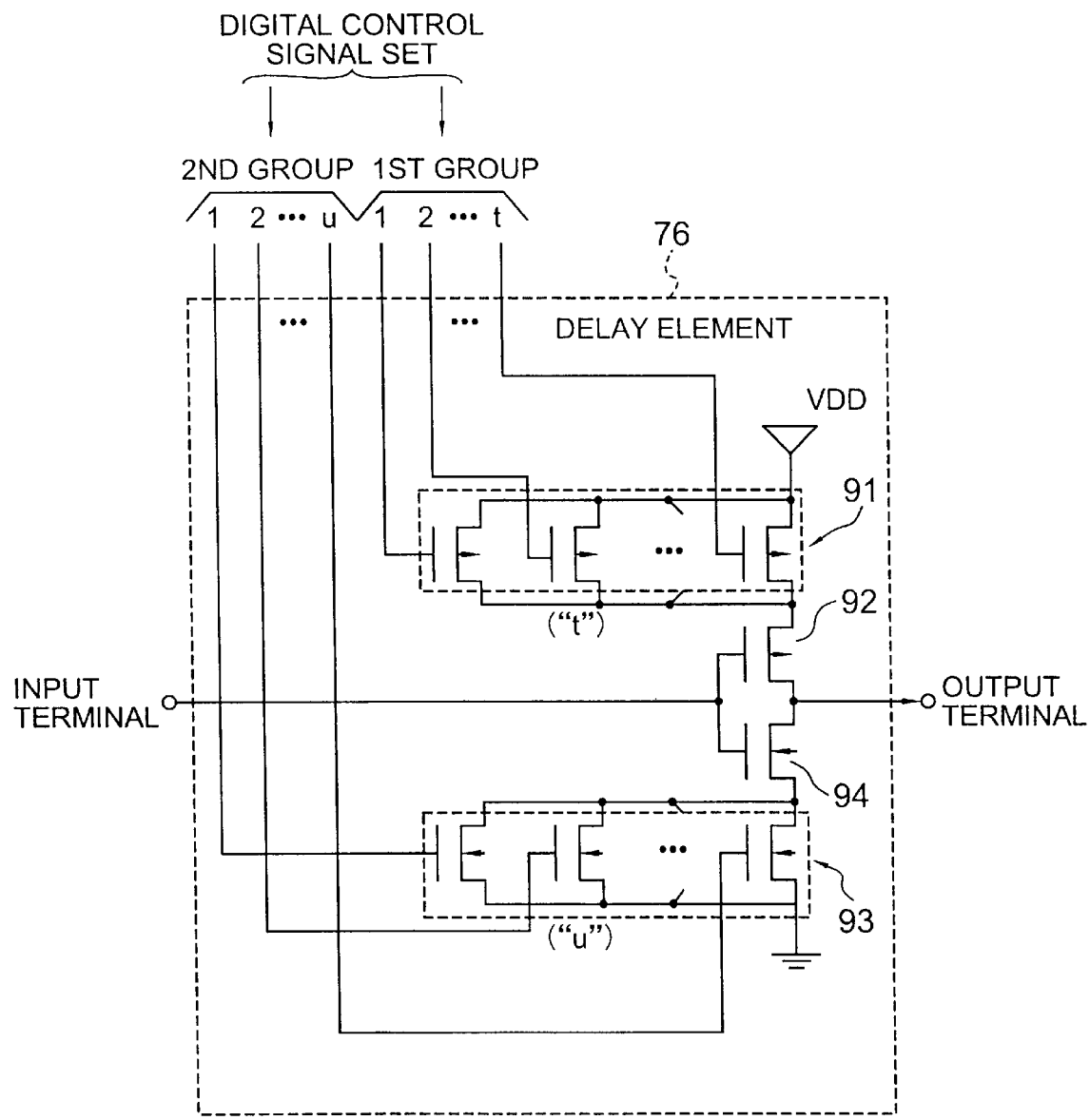
FIG. 9 is a circuit diagram of a delay element used in the digital phase locked loop of FIG. 7.

Referring to FIG. 9, the delay element 76 is described in detail.

The delay element 76 comprises a plurality of first P type transistors 91 which have first sources connected to source voltage VDD, first drains, and first gates connected to the delay control circuit 72. A second P type transistor 92 have a second source connected to the first drains, a second drain connected to the output terminal, and a second gate connected to the input terminal. A plurality of first N type transistors 93 have third sources connected to the ground, third drains, third gates connected to the delay control circuit 72. A second N type transistor 94 has a fourth source connected to the third drains, a fourth drain connected to the output terminal, and a fourth gate connected to the input terminal.

The first P type transistors 91 and the first N type transistors 93 are used for changing the delay of the delay element 76. The second P type transistor 92 and the second N type transistor 94 are used for deciding logic of the output signal.

The digital control signal set supplied from the delay controller 72 includes first and second groups of the digital control signals. If the number of the first P type transistors 91 is "t" (t≧2, t: integer), the first group includes "t" of the digital control signals. Similarly, the second group includes "u" (u≧2, u: integer) of the digital control signals when the number of the first N type transistors 93 is "u". The first P type transistors 91 and the first N type transistors 93 are selectively activated by the digital control signals.

The delay changes, for example, as shown in FIG. 10A or 10B. In these cases, four P type transistors and four N type transistors are used for the first P type transistors 91 and the first N type transistors 93, respectively. The digital control signals S1 through S4 which belongs to the first group are supplied to the first P type transistors 91 as they are. Moreover, the digital control signals S1 through S4 are inverted and supplies to the first N type transistors 93 as the second group. The first P type transistors 91 and the first N type transistors 93 in the case of FIG. 10A are different from them in the case of FIG. 10B in size.

In FIG. 10A, the delay takes one of eight delay times. The delay times include a minimum delay time. IF the minimum delay time is a criterion, the remains delay times are represented by integer multiples of the criterion. Namely, the eight delay times have regular steps among them. The delay can be actually changed in linear between the minimum delay time and a maximum delay time.

In FIG. 10B, the delay takes one of eight delay times which include a minimum delay time. IF the minimum delay time is a criterion, the remains delay times are represented by real number multiples of the criterion. Namely, the eight delay times have irregular steps among them. The delay can be actually changed in nonlinear between the minimum delay time and a maximum delay time.

If the first P type transistors 91 have a first common size (or electric characteristic) and the first N type transistors 93 have a second common size (or electric characteristic), the delay of the delay element 76 is decided by both of the number of activated first P type transistors 91 and the number of activated first N type transistors 93. Namely, the delay takes one of first predetermined delay times which are decided by the first P type transistors 91 and the first N type transistors 93.

Therefore, the delay is finely controlled by selective activation of the first P type and the first N type transistors 91 and 93. The delay can be changed by a minimum step which is a few picoseconds.

Because the delay element 76 are controlled by the digital control signal, the output signal does not influenced by noises (having a voltage of some [mV]) added on the digital control signal. Namely, the noises do not bring jitters on the output signal. Moreover, the delay element 76 stably operates even if the source voltage is lower voltage.

Figure 11:
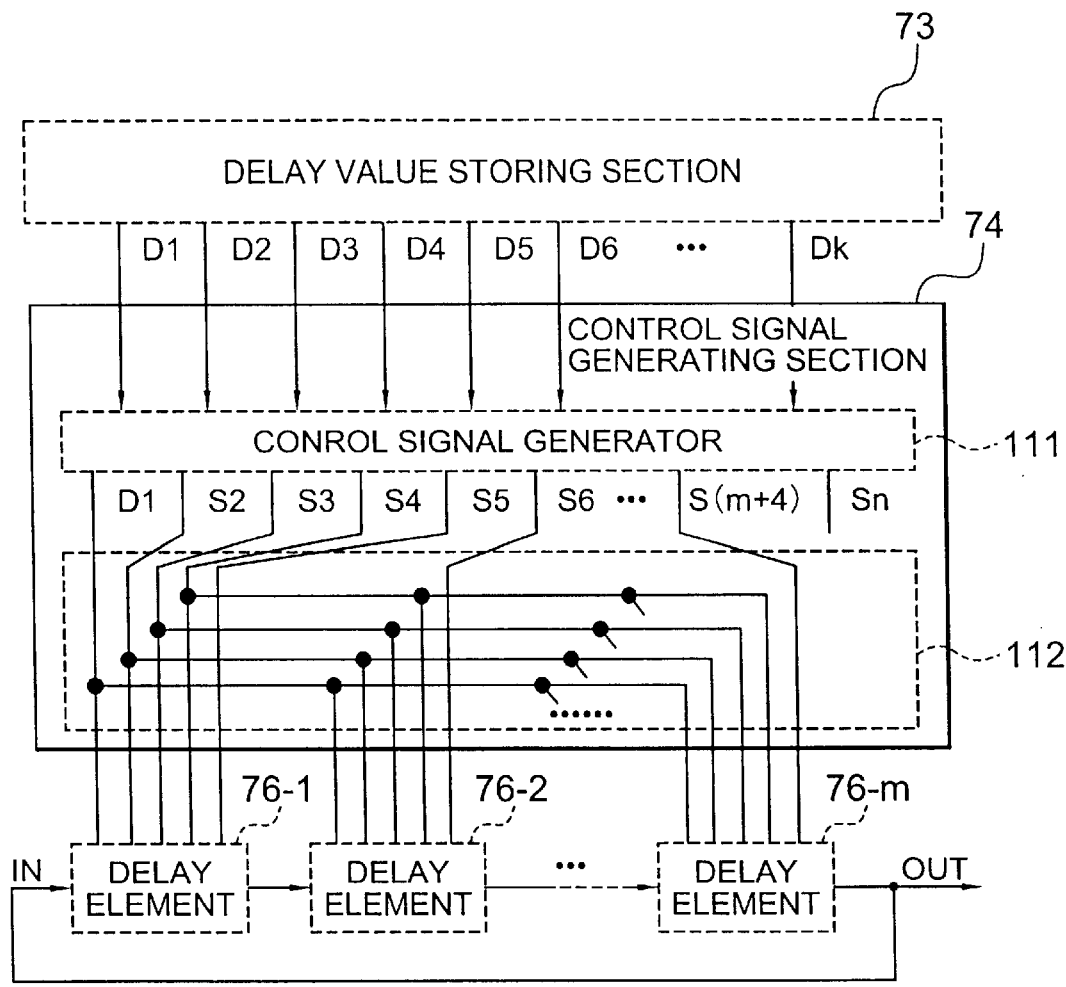
FIG. 11 is a block diagram for describing a connection between a control signal generating section and delay elements in the digital phase locked loop of FIG. 7.

In FIG. 11, the control signal generating section 74 has a control signal generator 111 and a combining section 112. The control signal generator 111 produces the digital control signals S1 through the Sn in response to the data signals D1 through Dk. The combining section 112 is connected to the control signal generator 111 and the delay elements 76-1 through 76-m to produce the digital control signal sets and to supplies them to the delay elements 76. The combining section 112 divides the digital control signals S1 through S4 into m to supply them to all of the delay elements 76-1 through 76-m. In addition, the combining section 112 supplies the digital control signal S5 through S(m+4) to the delay elements 76-1 through 76-m, respectively. Each of the digital control signal sets is used for the first group of the digital control signals as they are and is inverted to form the second group of the digital control signals in each delay element 76. This inversion may be carried out in the combining section 112. The combining section 112 may selectively divide the digital control signals into m to supply them to all of the delay elements. Moreover, the combining section 112 may selectively supplies the digital control signals to selected one of the delay elements 76.

Figure 12:
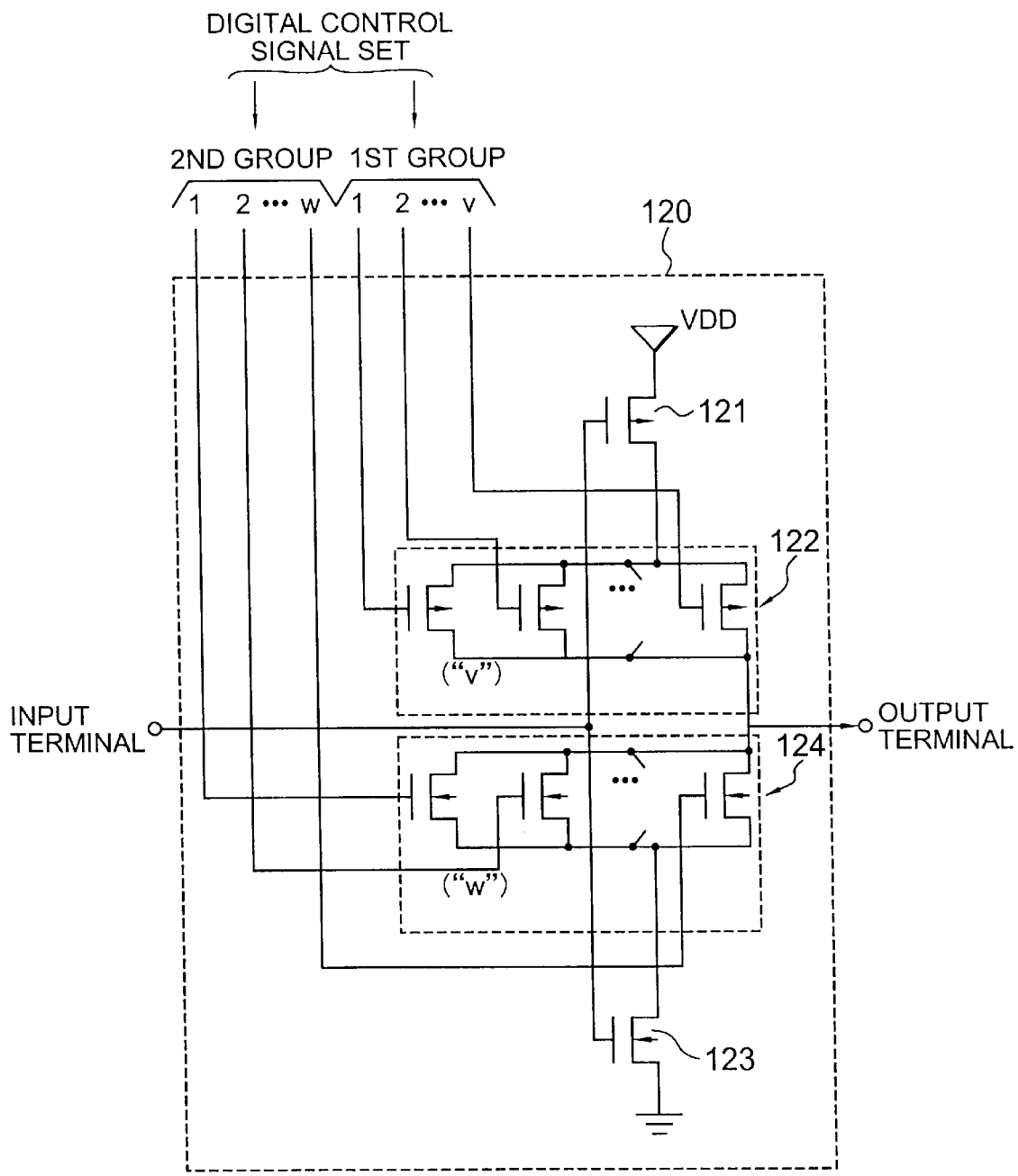
FIG. 12 is a circuit diagram of another delay element used in the digital phase locked loop of FIG. 7.

Referring to FIG. 12, description will be made about a delay element according to another embodiment of this invention.

In FIG. 12, the delay element 120 comprises a third P type transistor 121 which has a fifth source supplied with source voltage VDD, a fifth drain, and a fifth gate connected to the input terminal. A plurality of fourth P type transistors 122 have sixth sources connected to the fifth drain, sixth drains connected to the output terminal, and sixth gates connected to the delay control circuit 72. A third N type transistor having a seventh source connected to the ground, a seventh drain, and a seventh gate connected to the input terminal. A plurality of fourth N type transistors 124 have eighth sources connected to the seventh drain, eighth drains connected to the output terminal, and eighth gates connected to the control circuit 72.

The third P type transistor 121 and the third N type transistor 123 are used for deciding logic of the output signal. The fourth P type transistors 122 and the fourth N type transistors 124 are used for changing the delay of the delay element 120.

The digital control signal set supplied from the delay controller 72 includes third and fourth groups of the digital control signals. If the number of the fourth P type transistors 122 is "v" (v≧2, v: integer), the third group includes "v" of the digital control signals. Similarly, the fourth group includes "w" (w≧2, w: integer) of the digital control signals when the number of the fourth N type transistors 124 is "w". The fourth P type transistors 122 and the fourth N type transistors 124 are selectively activated by the digital control signals. If the fourth P type transistors 122 have a third common size (or electric characteristic) and the fourth N type transistors 124 have a fourth common size (or electric characteristic), the number of activated fourth P type transistors 122 and the number of activated fourth N type transistors 124 decide the delay of the delay element 120. Namely, the delay takes one of second predetermined delay times which are decided by the fourth P type transistors 122 and the fourth N type transistors 124. Therefore, the delay is finely controlled by selective activation of the fourth P type and the fourth N type transistors 122 and 124.

The delay element 120 is used like the delay element 76 shown in FIG. 9. In addition, the delay element 120 is used together with the delay element 76 as illustrated in FIGS. 13 and 14.

Figure 13:
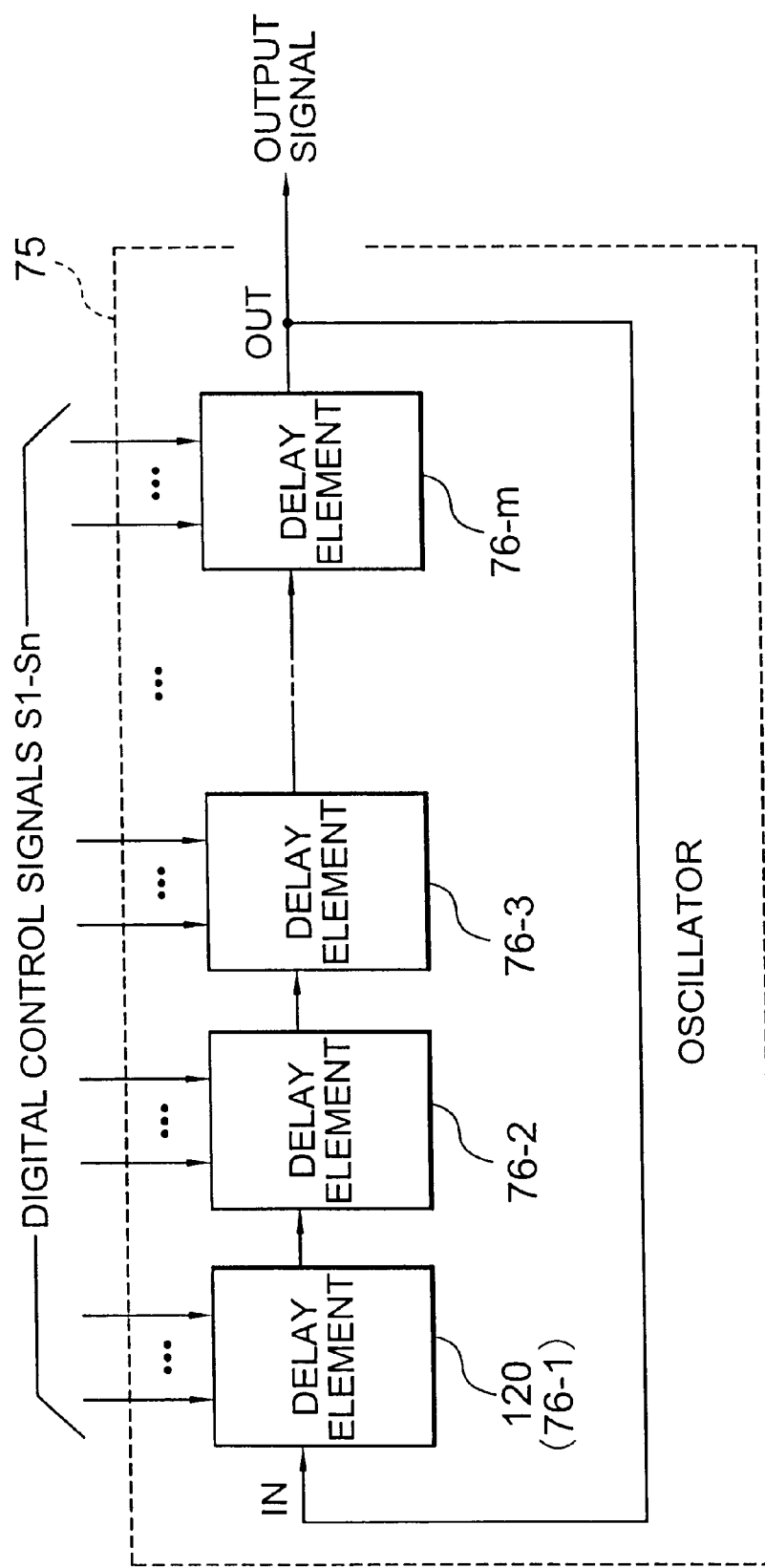
FIG. 13 is a block diagram of a oscillator used in the digital phase locked loop of FIG. 7.

In FIG. 13, the oscillator 75 has a first stage of the delay element 120. Each of the remaining stages is the delay element 76.

Figure 14:
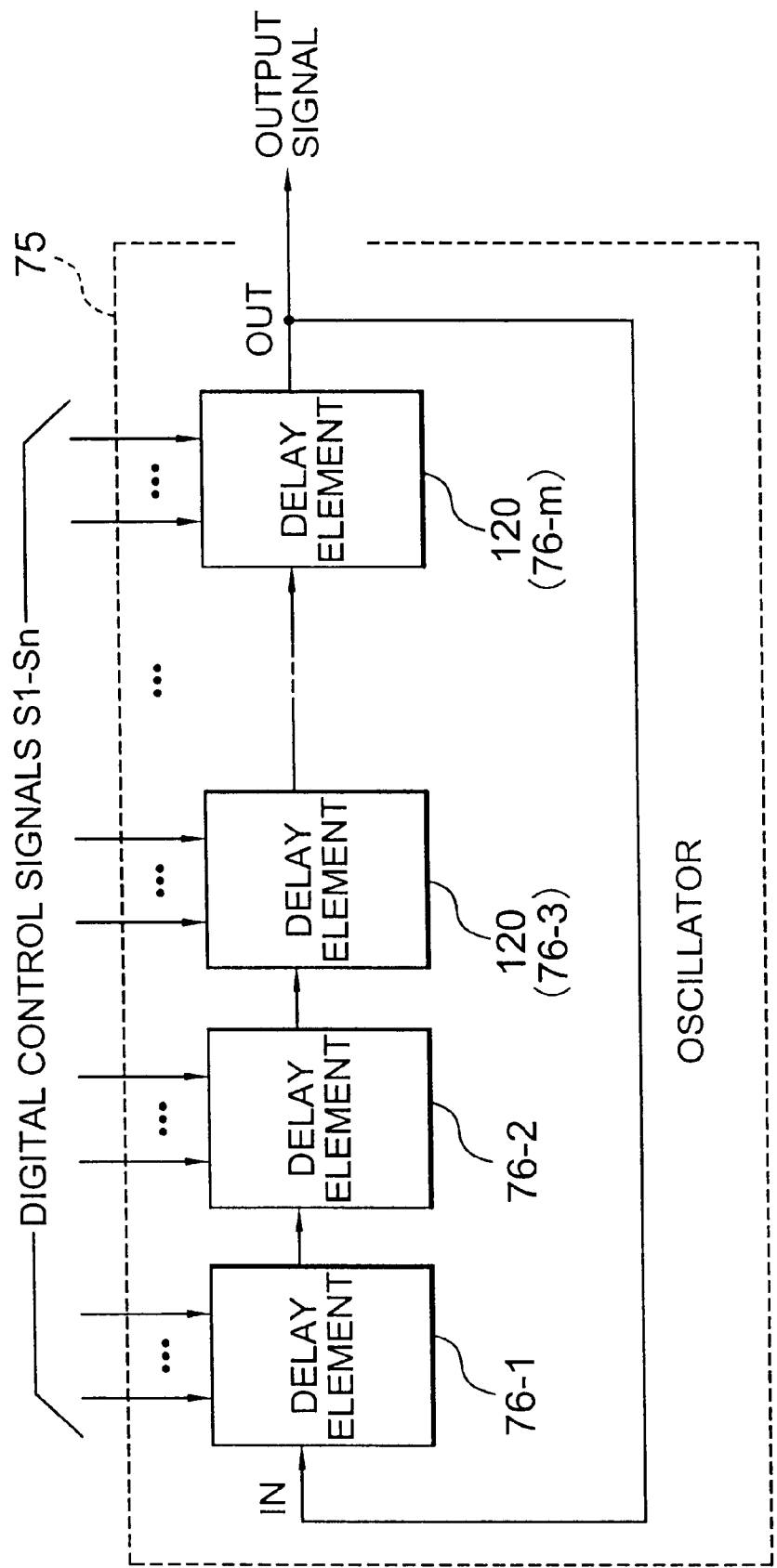
FIG. 14 is a block diagram of another oscillator used in the digital phase locked loop of FIG. 7.

In FIG. 14, the oscillator 75 has first and second stages of the delay elements 76 and the remaining stages of the delay elements 120.

It is assumed that the first predetermined delay times have first regular steps and the second predetermined delay times have second regular steps and that each of the first regular steps is smaller than each of the second regular steps. In a case that the delay element 76 is used together with the delay element 120, the control signal generating section 74 decides the delay for the delay element(s) 120 at first to produce the digital control signals. Then, the control signal generating section 74 decides the delay for the delay elements 76. If the delay element 120 is used for rough adjustment of the frequency of the output and the delay element 76 is used for fine adjustment of the frequency, a time for making the feedback signal accord with the reference signal becomes short.

When both of the delay element 76 and the delay element 120 are used in the oscillator 75, the delay stages is fewer than that including either of the delay element 76 or the delay element 120. Accordingly, electricity consumption of the oscillator 75 is smaller than the conventional digital phase locked loop shown in FIG. 4.

Figure 15:
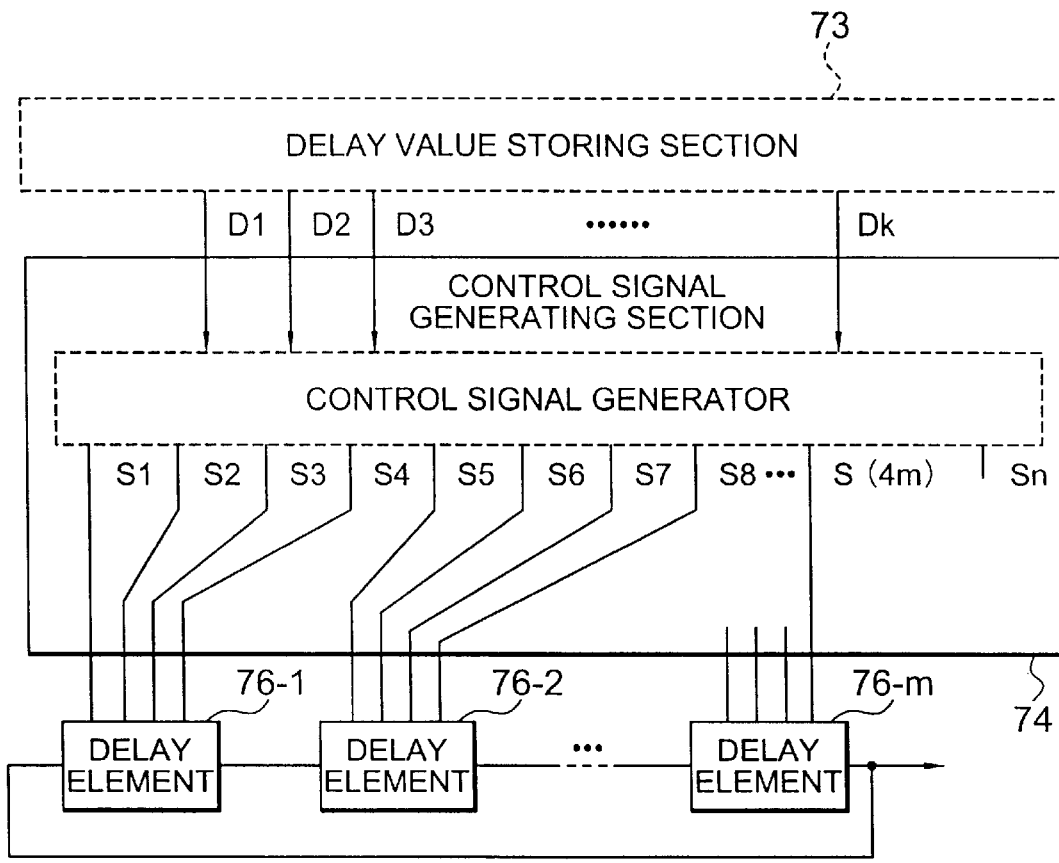
FIG. 15 is a block diagram for describing another connection between the control signal generating section and the delay elements in the digital phase locked loop of FIG. 7.

While this invention has thus for been described in conjunction with preferred embodiment thereof, it will readily be possible for those skilled in the art to put this invention into practice in various other manners. For example, the delay value storing section 73 may be a sift register or a up-and-down counter. In addition, the control signal generating section 74 is structured as shown in FIG. 15.

What is claimed is:

1. A digital phase locked loop for keeping an output signal exactly in phase and frequency with a reference signal, said digital phase locked loop comprising:

a phase comparator for comparing a feedback signal with the reference signal in phase and frequency to produce an error signal representative of frequency difference between the feedback signal and the reference signal;

a controller connected to said phase comparator for producing a plurality of digital control signal sets in response to the error signal, at least one of the plurality of digital control signal sets comprising a plurality of digital control signals;

an oscillator having a plurality of delay elements which are connected to said controller and connected to one another in a loop, each of said delay elements having a delay controlled by one of the digital control signal sets, said oscillator producing the output signal having a frequency decided by a total delay of said delay elements; and feedback means connected between said oscillator and said phase comparator for feeding back the output signal to said phase comparator as the feedback signal;

wherein said controller is operative to change said delay of each of said plurality of delay elements to change said total delay.

2. A digital phase locked loop for keeping an output signal exactly in phase and frequency with a reference signal, said digital phase locked loop comprising:

a phase comparator for comparing a feedback signal with the reference signal in phase and frequency to produce an error signal representative of frequency difference between the feedback signal and the reference signal, the error signal being an up/down signal for increasing/ decreasing the frequency;

a controller connected to said phase comparator for producing a plurality of digital control signal sets in response to the error signal, said controller comprising:

delay value storing means connected to said phase comparator for storing a delay value which is representative of the total delay and which is changed by the up/down signal to produce a delay value signal; and control signal generating means connected to said delay value storing means for producing the digital control signal sets in response to the delay value signal;

an oscillator having a plurality of delay elements which are connected to said controller and connected to one another in a loop, each of said delay elements having a delay controlled by one of the digital control signal sets, said oscillator producing the output signal having a frequency decided by a total delay of said delay elements; and feedback means connected between said oscillator and said phase comparator for feeding back the output signal to said phase comparator as the feedback signal.

3. A digital phase locked loop as claimed in claim 2, the up/down signal being an up signal or a down signal, wherein said delay value storing means is a bi-directional shift register which shifts the delay value toward a first direction when it receives the up signal and which shifts the delay value toward a second direction opposite to the first direction when it receives the down signal.

4. A digital phase locked loop as claimed in claim 1, wherein said controller supplies the digital control signal sets to said delay elements at the same timing.

5. A digital phase locked loop for keeping an output signal exactly in phase and frequency with a reference signal, said digital phase locked loop comprising:

a phase comparator for comparing a feedback signal with the reference signal in phase and frequency to produce an error signal representative of frequency difference between the feedback signal and the reference signal;

a controller connected to said phase comparator for producing a plurality of digital control signal sets in response to the error signal, said digital control signal sets being first through m-th (m: natural number) sets;

an oscillator having a plurality of delay elements which are connected to said controller and connected to one another in a loop, each of said delay elements having a delay controlled by one of the digital control signal sets, said oscillator producing the output signal having a frequency decided by a total delay of said delay elements, said delay elements being first through m-th delay elements which receive the first through the mth sets, respectively; and feedback means connected between said oscillator and said phase comparator for feeding back the output signal to said phase comparator as the feedback signal, wherein said controller produces first through n-th (n: natural number) preliminary digital control signals in response to the error signal to make the first through the m-th sets of the first through the n-th preliminary digital control signals.

6. A digital phase locked loop for keeping an output signal exactly in phase and frequency with a reference signal, said digital phase locked loop comprising:

a phase comparator for comparing a feedback signal with the reference signal in phase and frequency to produce an error signal representative of frequency difference between the feedback signal and the reference signal;

a controller connected to said phase comparator for producing a plurality of digital control signal sets in response to the error signal, each of the digital control signal sets including first and second groups of digital control signals;

an oscillator having a plurality of delay elements which are connected to said controller and connected to one another in a loop, each of said delay elements having a delay controlled by one of the digital control signal sets, said oscillator producing the output signal having a frequency decided by a total delay of said delay elements, each of said delay elements having an input terminal connected to the preceding delay element and having an output terminal connected to the following delay element; and feedback means connected between said oscillator and said phase comparator for feeding back the output signal to said phase comparator as the feedback signal, wherein each of said delay elements comprises:

a plurality of first P type transistors having first sources supplied with source voltage, first drains, and first gates connected to said controller to receive the first group;

a second P type transistor having a second source connected to said first drains, a second drain connected to said output terminal, and a second gate connected to said input terminal;

a plurality of first N type transistors having third sources connected to the ground, third drains, and third gates connected to said controller to receive the second group; and a second N type transistor having a fourth source connected to said third drains, a fourth drain connected to said output terminal, and a fourth gate connected to said input terminal.

7. A digital phase locked loop for keeping an output signal exactly in phase and frequency with a reference signal, said digital phase locked loop comprising:

a phase comparator for comparing a feedback signal with the reference signal in phase and frequency to produce an error signal representative of frequency difference between the feedback signal and the reference signal;

a controller connected to said phase comparator for producing a plurality of digital control signal sets in response to the error signal, each of the digital control signal sets including third and fourth groups of digital control signals;

an oscillator having a plurality of delay elements which are connected to said controller and connected to one another in a loop, each of said delay elements having a delay controlled by one of the digital control signal sets, said oscillator producing the output signal having a frequency decided by a total delay of said delay elements, each of said delay elements having an input terminal connected to the preceding delay element and having an output terminal connected to the following delay element, each of said delay elements comprising:

a third P type transistor having a fifth source supplied with source voltage, a fifth drain, and a fifth gate connected to said input terminal;

a plurality of fourth P type transistors having sixth sources connected to said fifth drain, sixth drains connected to said output terminal, and sixth gates connected to said controller to receive the third group;

a third N type transistor having a seventh source connected to the ground, a seventh drain, and a seventh gate connected to said input terminal; and a plurality of fourth N type transistors having eighth sources connected to said seventh drain, eighth drains connected to said output terminal, and eighth gates connected to said controller to receive the fourth group; and feedback means connected between said oscillator and said phase comparator for feeding back the output signal to said phase comparator as the feedback signal.

8. A digital phase locked loop for keeping an output signal exactly in phase and frequency with a reference signal, said digital phase locked loop comprising:

a phase comparator for comparing a feedback signal with the reference signal in phase and frequency to produce an error signal representative of frequency difference between the feedback signal and the reference signal;

a controller connected to said phase comparator for producing a plurality of digital control signal sets in response to the error signal;

an oscillator having a plurality of delay elements which are connected to said controller and connected to one another in a loop, each of said delay elements having a delay controlled by one of the digital control signal sets, said oscillator producing the output signal having a frequency decided by a total delay of said delay elements, said delay elements including first and second elements, said first element receiving first and second groups of the digital control signals included in one of the digital control signal sets, said second element receiving third and fourth groups of the digital control signals included in another one of the digital control signal sets, said first element comprising:

a first input terminal connected to a first preceding delay element;

a first output terminal connected to a first following delay element;

a plurality of first P type transistors having first sources supplied with source voltage, first drains, and first gates connected to said controller to receive the first group;

a second P type transistor having a second source connected to said first drains, a second drain connected to said first output terminal, and a second gate connected to said first input terminal;

a plurality of first N type transistors having third sources connected to the ground, third drains, and third gates connected to said controller to receives the second group; and a second N type transistor having a fourth source connected to said third drains, a third drain connected to said first output terminal, and a third gate connected to said first input terminal, said second element comprising:

a second input terminal connected to a second preceding delay element;

a second output terminal connected to a second following delay element;

a third P type transistor having a fifth source supplied with source voltage, a fifth drain, and a fifth gate connected to said second input terminal;

a plurality of fourth P type transistors having sixth sources connected to said fifth drain, sixth drains connected to said second output terminal, and sixth gates connected to said controller to receive the third group;

a third N type transistor having a seventh source connected to the ground, a seventh drain, and a seventh gate connected to said second input terminal; and a plurality of fourth N type transistors having eighth sources connected to said seventh drain, eighth drains connected to said second output terminal, and eighth gates connected to said controller to receive the fourth group; and feedback means connected between said oscillator and said phase comparator for feeding back the output signal to said phase comparator as the feedback signal.

9. A digital phase locked loop as claimed in claim 8, said first element having first steps for changing the delay in response to the first and the second groups, wherein said second element has second steps different from the first steps for changing the delay in response to the third and the fourth groups.

10. A delay element for use in a ring oscillator together with the preceding and the following delay elements, said delay element having a delay controlled by a digital control signal set which includes first and second groups of digital control signals, said delay element comprising:

an input terminal for connecting to said preceding delay element;

an output terminal for connecting to said following delay element;

a plurality of first P type transistors having first sources supplied with source voltage, first drains, and first gates for receiving the first group;

a second P type transistor having a second source connected to said first drains, a second drain connected to said output terminal, and a second gate connected to said input terminal;

a plurality of first N type transistors having third sources connected to the ground, third drains, and third gates for receiving the second group; and a second N type transistor having a fourth source connected to said third drains, a fourth drain connected to said output terminal, and a fourth gate connected to said input terminal.

11. A delay element as claimed in claim 10, wherein the delay takes one selected from predetermined delay times which have regular steps.

12. A delay element as claimed in claim 10, wherein the delay takes one selected from predetermined delay times which have irregular steps.

13. A delay element for use in a ring oscillator together with the preceding and the following delay element, said delay element having a delay controlled by a digital control signal set which includes third and fourth groups of digital control signals, said delay element comprising:

an input terminal for connecting to said preceding delay element;

an output terminal for connecting to said following delay element;

a third P type transistor having a fifth source supplied with source voltage, a fifth drain, and a fifth gate connected to said input terminal;

a plurality of fourth P type transistors having sixth sources connected to a fifth drain, sixth drains connected to said output terminal, and sixth gates for receiving the third group;

a third N type transistor having a seventh source connected to the ground, a seventh drain, and a seventh gate connected to said input terminal; and a plurality of fourth N type transistors having eighth sources connected to said seventh drain, eighth drains connected to said output terminal, and eighth gates for receiving the fourth group.

14. A delay element as claimed in claim 13, wherein the delay takes one selected from predetermined delay times which have regular steps.

15. A digital phase locked loop as claimed in claim 1, the error signal being an up/down signal for increasing/decreasing the frequency, wherein said controller comprises:

a delay value storing section connected to said phase comparator and operative to store a delay value that is representative of the total delay and that is changed by the up/down signal to produce a delay value signal; and a control signal generator connected to said delay value storing section and operative to produce the digital control signal sets in response to the delay value signal.

16. A digital phase locked loop as claimed in claim 2, the up/down signal being an up signal or a down signal, wherein said delay value storing section is a bi-directional shift register that shifts the delay value toward a first direction when it obtains the up signal and that shifts the delay value toward a second direction opposite to the first direction when it obtains the down signal.

17. A digital phase locked loop as claimed in claim 6, wherein said first P-type transistors are operative to change a delay of a corresponding one of the delay elements said first P-type transistors are disposed in.

18. A digital phase locked loop as claimed in claim 17, wherein said first P-type transistors are operative to change a delay linearly between a minimum and a maximum delay time.

* * * * *